US00RE47743E

(19) United States
(12) Reissued Patent
Hsu et al.

(10) Patent Number: US RE47,743 E
(45) Date of Reissued Patent: Nov. 26, 2019

(54) OUTPUT BUFFER CIRCUIT AND METHOD FOR AVOIDING VOLTAGE OVERSHOOT

(71) Applicant: NOVATEK Microelectronics Corp., Hsin-Chu (TW)

(72) Inventors: Xie-Ren Hsu, Hsinchu (TW); Ji-Ting Chen, Hsinchu County (TW)

(73) Assignee: NOVATEK Microelectronics Corp., Hsin-Chu (TW)

(21) Appl. No.: 14/800,712

(22) Filed: Jul. 16, 2015

Related U.S. Patent Documents

Reissue of:
(64) Patent No.: 8,487,687
Issued: Jul. 16, 2013
Appl. No.: 12/750,671
Filed: Mar. 30, 2010

(30) Foreign Application Priority Data

Jan. 27, 2010 (TW) ..... 99102238 A

(51) Int. Cl.
*H03K 5/08* (2006.01)
*H03F 3/45* (2006.01)

(52) U.S. Cl.
CPC ..... *H03K 5/08* (2013.01); *H03F 3/45* (2013.01)

(58) Field of Classification Search
None
See application file for complete search history.

(56) References Cited

U.S. PATENT DOCUMENTS 4,378,506 A * 3/1983 Taira ..... H01L 27/0222 257/368
4,920,280 A * 4/1990 Cho ..... G05F 3/205 327/536
5,253,204 A * 10/1993 Hatakeyama ..... G11C 11/4085 365/189.06
5,293,081 A * 3/1994 Chiao ..... G06F 7/57 326/83
5,545,934 A * 8/1996 Reddy ..... G05F 3/205 307/116
5,894,238 A * 4/1999 Chien ..... H03K 19/00361 326/26
6,300,834 B1 * 10/2001 Lin ..... H03F 3/3028 330/257

(Continued)

FOREIGN PATENT DOCUMENTS

TW 200701641 1/2007

*Primary Examiner* — Glenn K Dawson
(74) *Attorney, Agent, or Firm* — Winston Hsu

(57) ABSTRACT

An output buffer circuit for avoiding voltage overshoot includes an input stage, an output bias circuit, an output stage, a clamp circuit, and a control unit. The input stage includes a positive input terminal, for receiving an input voltage, and a negative input terminal. The input stage generates a current signal according to the input voltage. The output bias circuit is coupled to the input stage, for generating a dynamic bias according to the current signal. The output stage is coupled to the input stage and the output bias circuit, including an output terminal, reversely coupled to the positive input terminal, and at least one output transistor, coupled to the output bias circuit and the output terminal, for providing a driving current to the output terminal according to the dynamic bias to generate an output voltage.

24 Claims, 6 Drawing Sheets

AMENDED

(56) References Cited

U.S. PATENT DOCUMENTS

| | | | | |
|---|---|---|---|---|
| 7,145,364 | B2 * | 12/2006 | Bhattacharya et al. | H03K 3/012 326/68 |
| 7,358,812 | B2 | 4/2008 | Portmann | H03F 3/45192 330/255 |
| 7,595,690 | B2 * | 9/2009 | Tso et al. | H03F 3/3022 330/255 |
| 8,686,708 | B2 * | 4/2014 | Ishimori | H02M 3/073 323/350 |
| 2002/0024873 | A1 * | 2/2002 | Tomishima | G11C 11/407 365/230.06 |
| 2005/0013084 | A1 * | 1/2005 | Weger | H01F 27/38 361/143 |
| 2005/0068794 | A1 * | 3/2005 | Weng | H02M 1/34 363/50 |
| 2005/0146313 | A1 * | 7/2005 | Liao | H02M 1/36 323/284 |
| 2006/0170498 | A1 * | 8/2006 | Portmann | H03F 3/45192 330/255 |
| 2006/0192587 | A1 * | 8/2006 | Bhattacharya | H03K 3/012 326/80 |
| 2007/0018623 | A1 * | 1/2007 | Lopata | G05F 1/575 323/282 |
| 2007/0159250 | A1 * | 7/2007 | Tsuchi et al. | H03F 3/45233 330/253 |
| 2008/0252375 | A1 * | 10/2008 | Tso | H03F 3/3022 330/253 |
| 2009/0278602 | A1 * | 11/2009 | Matalon | H03F 1/526 330/255 |
| 2009/0310385 | A1 * | 12/2009 | Maksimovic | H02M 3/157 363/21.1 |

* cited by examiner

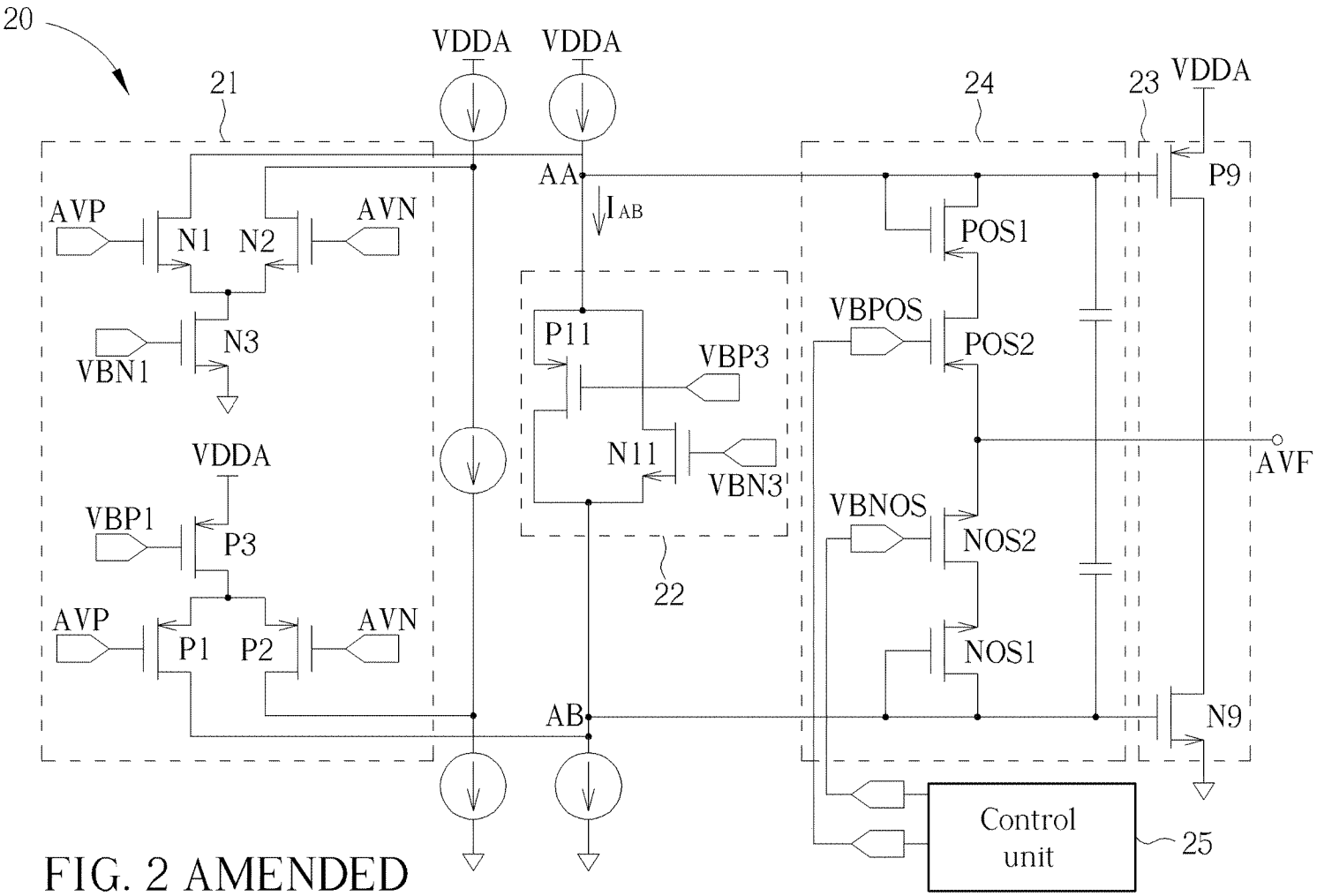
FIG. 2 AMENDED

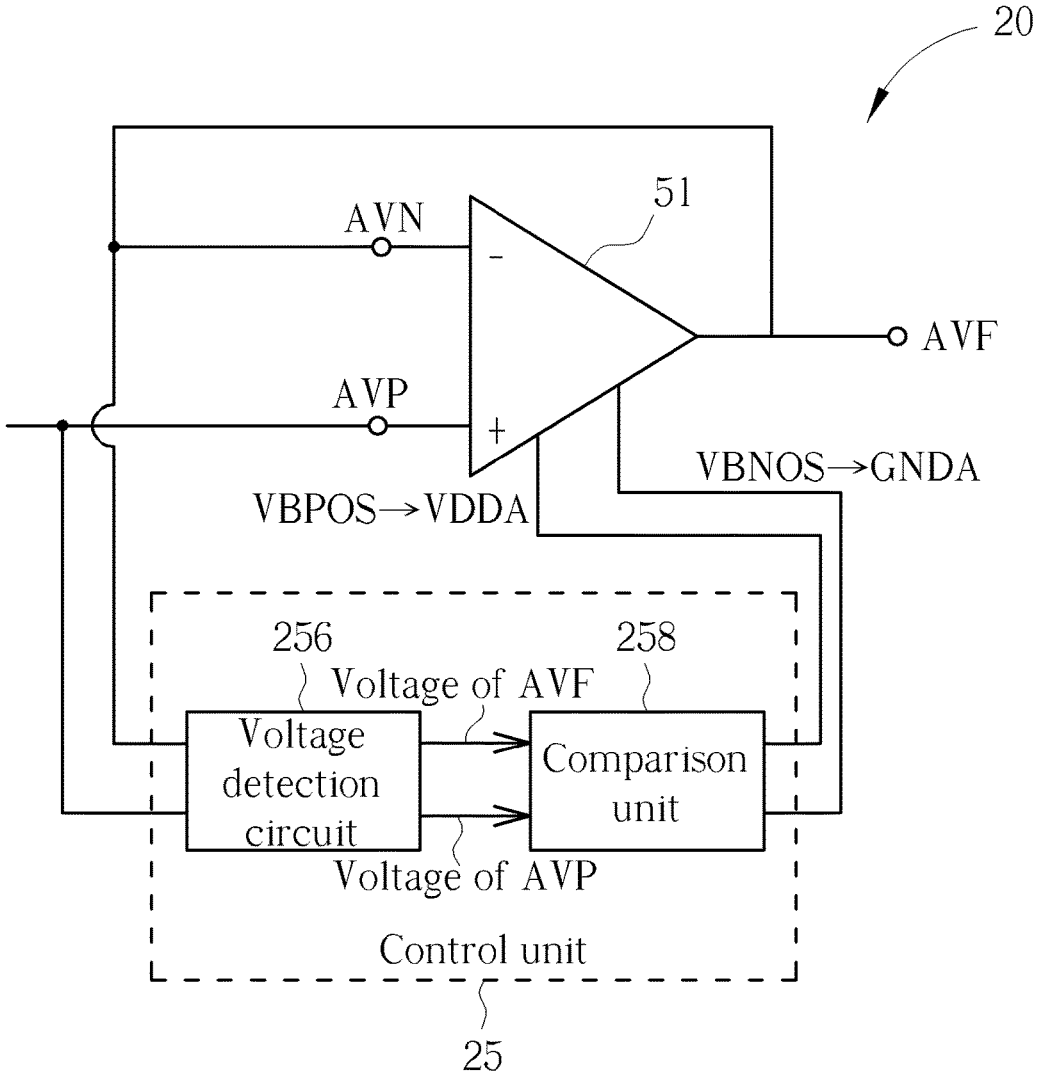
FIG. 5 AMENDED

OUTPUT BUFFER CIRCUIT AND METHOD FOR AVOIDING VOLTAGE OVERSHOOT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

The present invention relates to an output buffer circuit for avoiding voltage overshoot, and more particularly, to an output buffer circuit that prevents leakage currents from changing a systematic offset voltage by timely closing a clamping circuit.

2. Description of the Prior Art

An output stage of a present display driver adopts an operational amplifier circuit to rapidly charge and discharge a load end, such that driving capability of the display driver is enhanced. However, if inner currents of the operational amplifier cannot be recovered immediately, the rapid charging or discharging of the load end would a voltage overshoot. In general, a clamping circuit is added between an output terminal of the operational amplifier and an input terminal of the output stage thereof to avoid the voltage overshoot. However, under a situation that the operational amplifier has full swing output, the clamping circuit may not be completely closed, resulting in certain leakage currents (in approximate nA degree). For low power application, such leakage currents may change a systematic offset voltage of the display driver.

Please refer to FIG. 1. FIG. 1 is a schematic diagram of an operational amplifier 10 according to the prior art. The operational amplifier 10 is a two stage amplifier, and includes an input stage 11, an output bias circuit 12, an output stage 13 and a clamping circuit 14. The input stage 11 is a differential input stage having a rail-to-rail input range, and includes a positive input terminal AVP and a negative input terminal AVN. *The input stage 11 includes input transistors N1, N2, P1 and P2 coupled to the input terminals AVP and AVN and bias transistors N3 and P3 coupled to the bias terminals VBN1 and VBP1, respectively.* The input stage 11 generates a current signal IAB according to an input voltage received by the positive input terminal AVP. The output bias circuit 12 is coupled to the input stage 11, for generating a dynamic bias VAB between nodes AA and AB (i.e. a voltage difference between the node AA and the node AB) according to the current signal IAB. The output stage 13 is a class AB output stage composed of transistors P9 and N9, and includes an [input] *output* terminal AVF reversely coupled to the negative input terminal AVN of the input stage 11. The output stage 13 provides a driving current to the output terminal AVF according to the dynamic bias VAB, so as to generate an output voltage. The clamping circuit 14 consists of transistors POS1, POS2, NOS1, and NOS2, for maintaining the output voltage of the operational amplifier 10 within a predefined range, so as to avoid the voltage overshoot.

When the operational amplifier 10 charges the load, such as receiving a high level input voltage, a voltage of the positive input terminal AVP increases, such that the current signal IAB flowing through the output bias circuit 12 decreases, and results in decrease of voltages of the nodes AA and AB. Under such circumstances, the output stage 13 increases the driving current for the output terminal AVF to enhance the output voltage of the operational amplifier, as shown by solid lines in FIG. 1. On the contrary, when the operational amplifier 10 discharges the load, such as receiving a low level input voltage, the voltage of the positive input terminal AVP decreases, such that the current signal IAB flowing through the output bias circuit 12 increases, and results in increase of the voltages of the nodes AA and AB. Under such circumstances, the output stage 13 reduces the driving current for the output terminal AVF to decrease the output voltage of the operational amplifier, as shown by dot lines in FIG. 1.

Under normal conditions, a level of the output voltage makes overdrive voltages of the transistors POS2 or NOS2 smaller than threshold voltages thereof, i.e. (AVF-VBPOS) <Vthp or (VBNOS-AVF)<Vthn, and results in the transistors POS2 or NOS2 being closed. Hence, the clamping circuit 14 has no effects on the charging and discharging operations of the operational amplifier. Whereas, when the level of the output voltage exceeds a predefined range, the overdrive voltages of the transistors POS2 or NOS2 are larger than the threshold voltages thereof, i.e. (AVF-VBPOS)>Vthp or (VBNOS-AVF)>Vthn, which results in the transistors POS2 or NOS2 being on. In this case, currents flowing from the output terminal AVF into the nodes AA or AB help the voltages of the nodes AA or AB to return to a normal level, so as to alleviate the voltage overshoot.

However, incases that the operational amplifier has full swing output, the transistors POS2 or NOS2 may not be completely closed, resulting in a certain leakage currents. Take the discharging operation as an example, the output voltage of the operational amplifier may be as low as 0.1 volt, thereby the transistors NOS1 and NOS2 cannot be completely closed, and results in a certain currents flowing through the transistors NOS1 and NOS2 (from the output terminal AVF into the node AB). For the low power application, currents of each path in the operational amplifier become lower and lower, thereby it becomes obvious that variations of currents flowing through the transistors P11 and N11 and a variation of the overdrive voltage caused by the leakage currents, so as to influence a bias status and a static current of the output stage 13. With a change to the static current of the output stage 13, a transconductance of the output stage 13 and a gain of the operational amplifier would also vary. The gain of the operational amplifier directly influences a systematic offset voltage of the operational amplifier.

In brief, for the low power application, the current of each path of the operational amplifier becomes lower with time. In the full swing output case, the clamping circuit cannot be completely closed, resulting in a more obvious change to the static current of the output bias circuit. Accordingly, the gain of the whole operational amplifier changes, so as to influence the systematic offset voltage of the operational amplifier.

SUMMARY OF THE INVENTION

It is therefore a primary objective of the claimed invention to provide an output buffer circuit and method for avoiding voltage overshoot.

The present invention discloses an output buffer circuit for avoiding voltage overshoot. The output buffer circuit includes an input stage, an output bias circuit, an output stage, a clamp circuit, and a control unit. The input stage includes a positive input terminal, for receiving an input voltage, and a negative input terminal. The input stage generates a current signal according to the input voltage. The output bias circuit is coupled to the input stage, for generating a dynamic bias according to the current signal. The output stage is coupled to the input stage and the output bias circuit, including an output terminal, reversely coupled to the positive input terminal, and at least one output transistor, coupled to the output bias circuit and the output terminal, for providing a driving current to the output terminal according to the dynamic bias to generate an output voltage. The clamp circuit is coupled to the input stage, the output bias circuit and the output stage, for drawing currents from the output terminal to help the current signal to return the dynamic bias to a proper level when the output voltage exceeds a predefined range. The control unit is coupled to the clamp circuit, for activating the clamp circuit when the output buffer circuit receives the input voltage and for deactivating the clamp circuit when the output voltage reaches a steady state.

The present invention further discloses a method of avoiding voltage overshoot for an output buffer circuit. The output buffer circuit includes an input stage, an output stage and a clamp circuit. The input stage generates a current signal according to an input voltage. The output stage generates an output voltage according to the current signal. The clamp circuit is coupled to the input stage and the output stage, for clamping the output voltage within a predefined range. The method includes activating the clamp circuit when the input voltage is received, starting to output the output voltage, and deactivating the clamp circuit when the output voltage reaches a steady state.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a schematic diagram of an output buffer circuit capable of improving voltage overshoot according to an embodiment of the present invention.

FIG. 5 is a schematic diagram of the control unit in FIG. 1 according to another embodiment of the present invention.

DETAILED DESCRIPTION

Figure 1:
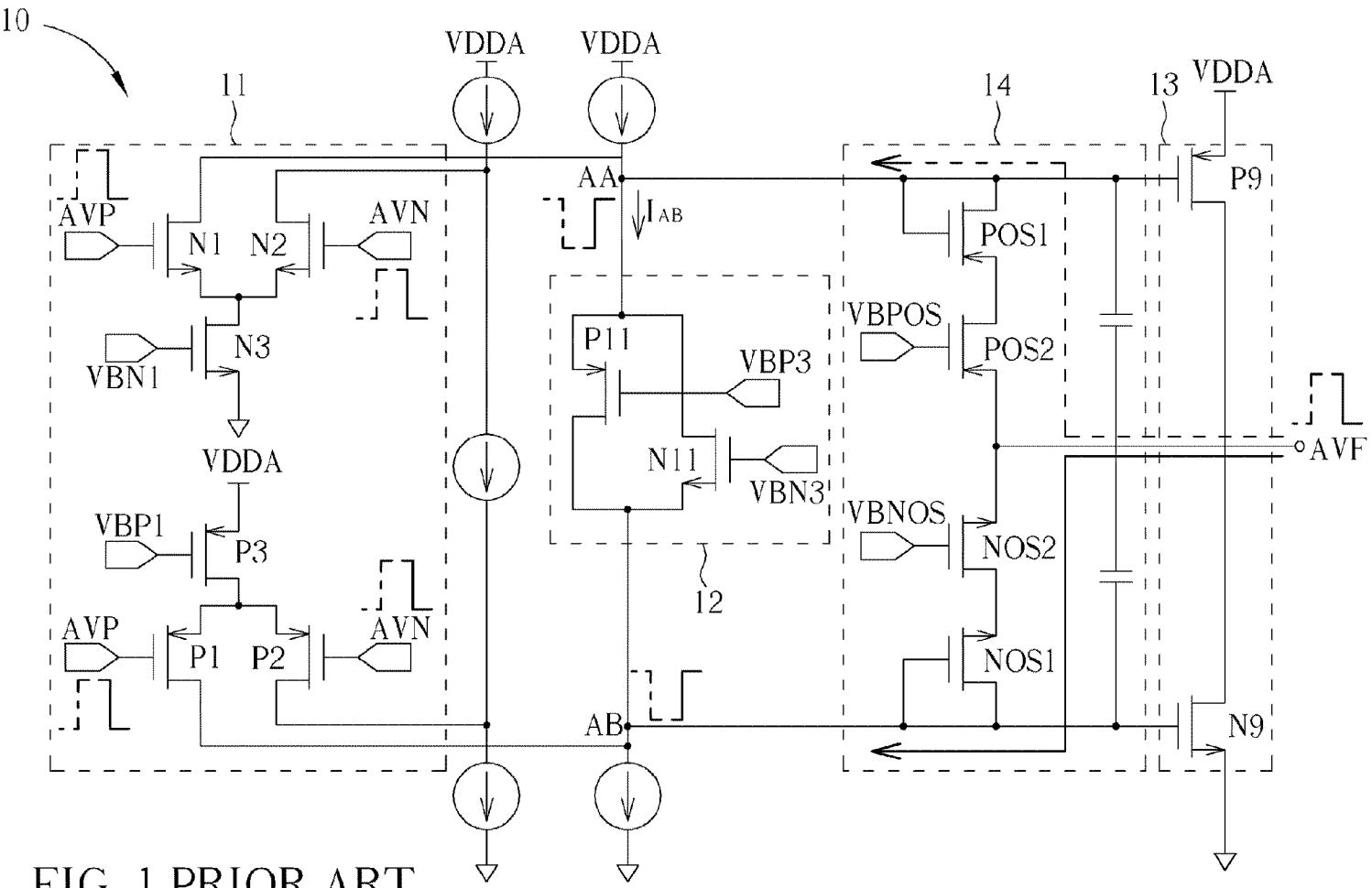
FIG. 1 PRIOR ART
FIG. 1 is a schematic diagram of an operational amplifier according to the prior art.

Please refer to FIG. 2. FIG. 2 is a schematic diagram of an output buffer circuit 20 capable of improving voltage overshoot according to an embodiment of the present invention. The output buffer circuit 20 includes an input stage 21, an output bias circuit 22, an output stage 23, a clamping circuit 24 and a control unit 25. The input stage 21 is a differential input stage having a rail-to-rail input range, and includes a positive input terminal AVP and a negative input terminal AVN. *The structure of the input stage 21 is similar to the structure of the input stage 11, so the elements and signals having similar functions are denoted by the same symbols.* The input stage [11] *21* generates a current signal IAB according to an input voltage received by the positive input terminal AVP. The output bias circuit 22 is coupled to the input stage 21, for generating a dynamic bias VAB between nodes AA and AB (i.e. a voltage difference between the node AA and the node AB) according to the current signal IAB. The output stage 23 is a class AB output stage composed of transistors P9 and N9, and includes an input terminal AVF reversely coupled to the negative input terminal AVN of the input stage 21. The output stage 23 provides a driving current to the output terminal AVF according to the dynamic bias VAB, so as to generate an output voltage. The clamping circuit 24 consists of transistors POS1, POS2, NOS1, and NOS2, for drawing currents from the output terminal AVF to help the current signal IAB for returning the dynamic bias to a predefined level when the output voltage exceeds a predefined range, so as to avoid the voltage overshoot. The control unit 25 is coupled to the clamp circuit 24, for activating the clamp circuit 24 when the output buffer circuit 20 receives the input voltage and for deactivating the clamp circuit 24 when the output voltage reaches a steady state. Please note that the input stage 21, the output bias circuit 22, the output stage 23 and the clamping circuit 24 are merely an exemplary embodiment of the present invention, which can be implemented by any kind of operational amplifier circuit, and is not limited to this.

In the embodiment of the present invention, the transistors POS1 and POS2 are P-type metal-oxide-semiconductor field-effect (MOSFET) transistors, for clamping the output voltage under a predefined high voltage level; while the transistors NOS1 and NOS2 are N-type MOSFETs, for clamping the output voltage over a predefined low voltage level. A gate of the transistor POS2 is coupled to an operating bias VBPOS, while a gate of the transistor NOS2 is coupled to an operating bias VBNOS. The operating biases VBPOS and VBNOS are switched by the control unit 25. When the output buffer circuit 20 receives the input voltage, the control unit 25 switches the operating biases VBPOS and VBNOS to a normal bias level to activate the clamping circuit 24; whereas, when a voltage level of the output terminal AVF reaches a steady state, the control unit 25 switches the operating biases VBPOS and VBNOS to a power supply voltage VDDA and a ground voltage GNDA, respectively. Such that the transistors POS2 and NOS2 are closed, so as to deactivate the clamping circuit 24.

Figure 3:
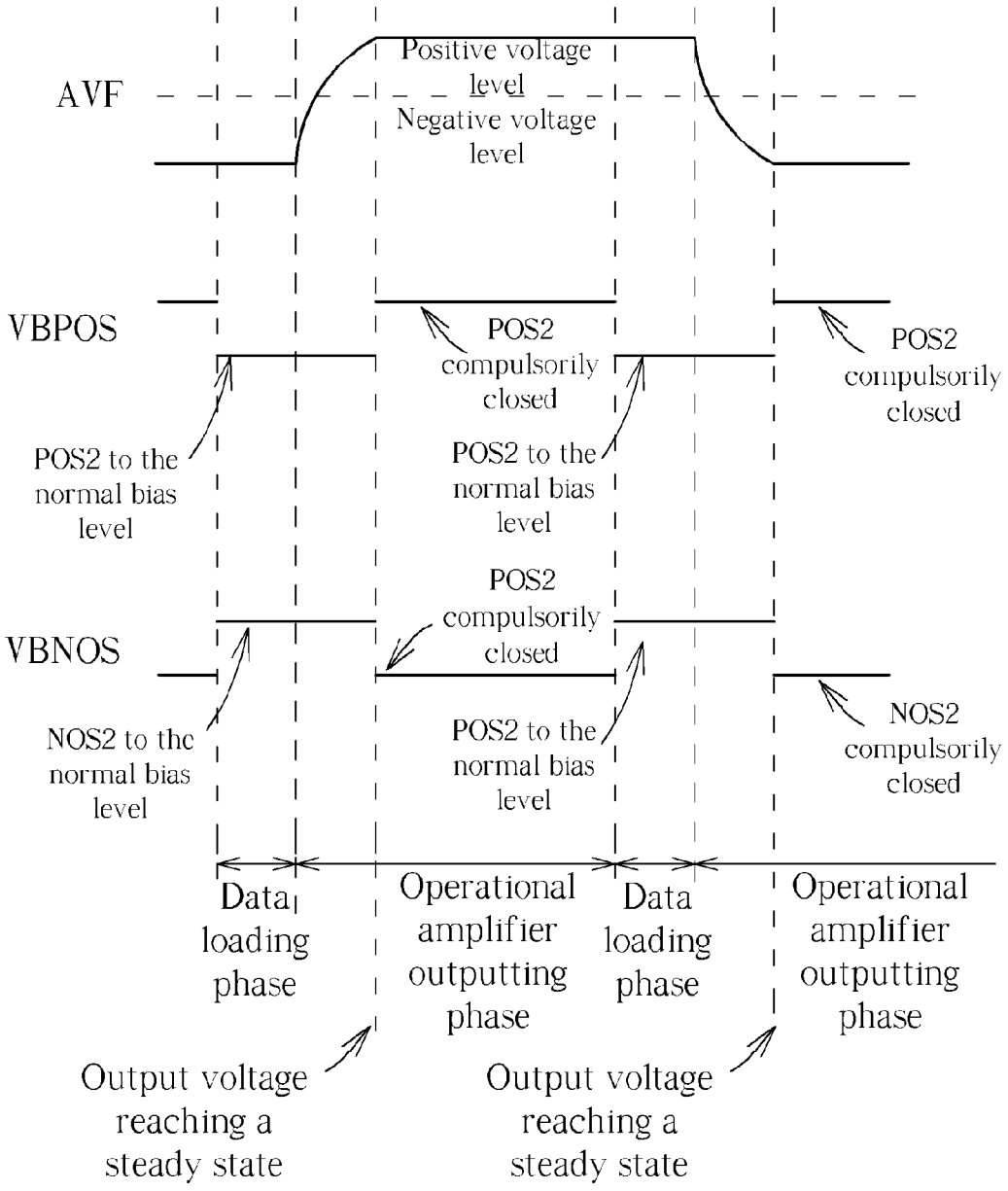
FIG. 3 is a timing diagram of signals of the output buffer circuit in FIG. 2.

Please refer to FIG. 3. FIG. 3 is a timing diagram of signals of the output buffer circuit 20 in FIG. 2. First, in a data loading phase, the output buffer circuit 20 receives an analog voltage outputted from a pre-stage circuit. Meanwhile, the operating biases VBPOS and VBNOS are switched to the normal bias level, respectively. Such that the clamping circuit 24 is activated to prevent the voltage level of the output terminal AVF from the voltage overshoot. Next, when the voltage level of the output terminal AVF reaches the steady state, the control unit 25 switches the operating biases VBPOS and VBNOS to the power supply voltage VDDA and the ground voltage GNDA, respectively. Such that the transistors POS2 and NOS2 are closed compulsorily, so as to eliminate currents flowing through the transistors POS1, POS2, NOS1, and NOS2. As a result, when the output voltage reaches the steady state, the embodiment of the present invention can prevent the leakage currents of the clamping circuit 24 from attacking the bias status of the output stage and the gain of the whole operational amplifier.

In the embodiment of the present invention, the control unit 25 can determine whether the output voltage reaches the steady state by following two methods, and is not limited to these. One method is determining the output voltage reaches the steady state when the output buffer circuit 20 receives the [output] *input* voltage for a predefined time; while the other method is determining whether the output voltage reaches the steady state by detecting voltage difference between the output terminal AVF and the positive input terminal AVP after the output buffer circuit 20 receives the input voltage.

Figure 4:
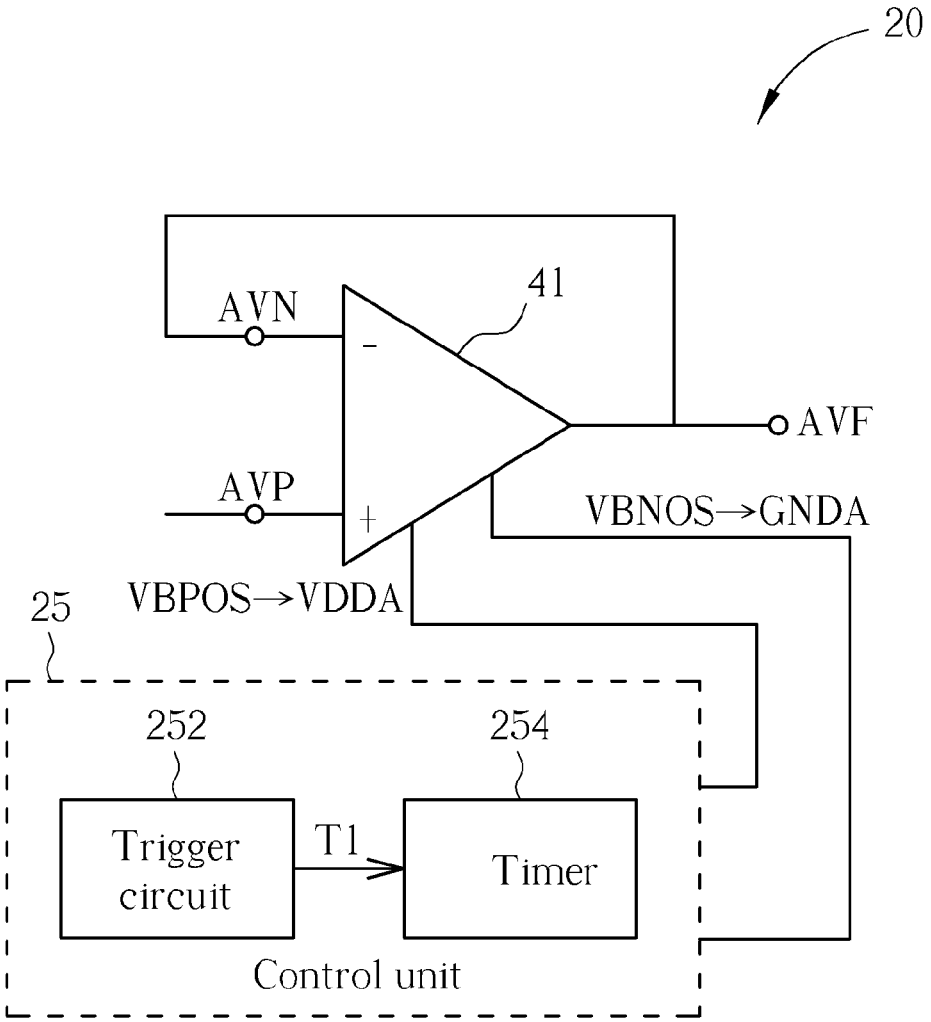
FIG. 4 is a schematic diagram of the control unit in FIG. 1 according to an embodiment of the present invention.

For example, please refer to FIG. 4. FIG. 4 is a schematic diagram of the control unit 25 in FIG. 1 according to an embodiment of the present invention. For clarity, the input stage 21, the output bias circuit 22, the output stage 23 and the clamping circuit 24 in FIG. 1 are represented by an operational amplifier 41. As shown in FIG. 4, the control unit 25 includes a trigger circuit 252 and a timer 254. The trigger circuit 252 is used for generating a trigger signal T1 when the output buffer circuit 20 receives the input voltage, such as entering the data load phase. The timer 254 is coupled to the trigger circuit 252, for calculating the predefined time according to the trigger signal T1, so as to provide a basis for the control unit 25 to determine whether the output voltage reaches the steady state. As a result, after the predetermined time, the control unit 25 is able to switch the operating biases VBPOS and VBNOS to the power supply voltage VDDA and the ground voltage GNDA, respectively, so as to deactivate the clamping circuit 24.

Please refer to FIG. 5. FIG. 5 is a schematic diagram of the control unit 25 in FIG. 1 according to another embodiment of the present invention. Similarly, the input stage 21, the output bias circuit 22, the output stage 23 and the clamping circuit 24 in FIG. 1 are represented by an operational amplifier 51. As shown in FIG. 5, the control unit 25 includes a voltage detection circuit 256 and a comparison unit 258. The voltage detection circuit 256 is coupled to the positive input terminal AVP and the output terminal AVF, for detecting voltage levels of the positive input terminal AVP and the output terminal AVF. The comparison unit 258 is coupled to the voltage detection circuit 256, for determining that the output voltage reaches the steady state when the voltage difference between the output terminal AVF and the positive input terminal AVP is smaller than a predefined value. Therefore, when the output voltage reaches the steady state, the control unit 25 is able to switch the operating biases VBPOS and VBNOS to the power supply voltage VDDA and the ground voltage GNDA, respectively, so as to deactivate the clamping circuit 24.

Through the above embodiments, the present invention is able to solve a problem that the clamping circuit cannot be completely closed and therefore influences the systematic offset voltage of the operational amplifier. Additionally, circuit characteristics become more stable without extra current consumption and area cost for the operational amplifier.

Figure 6:
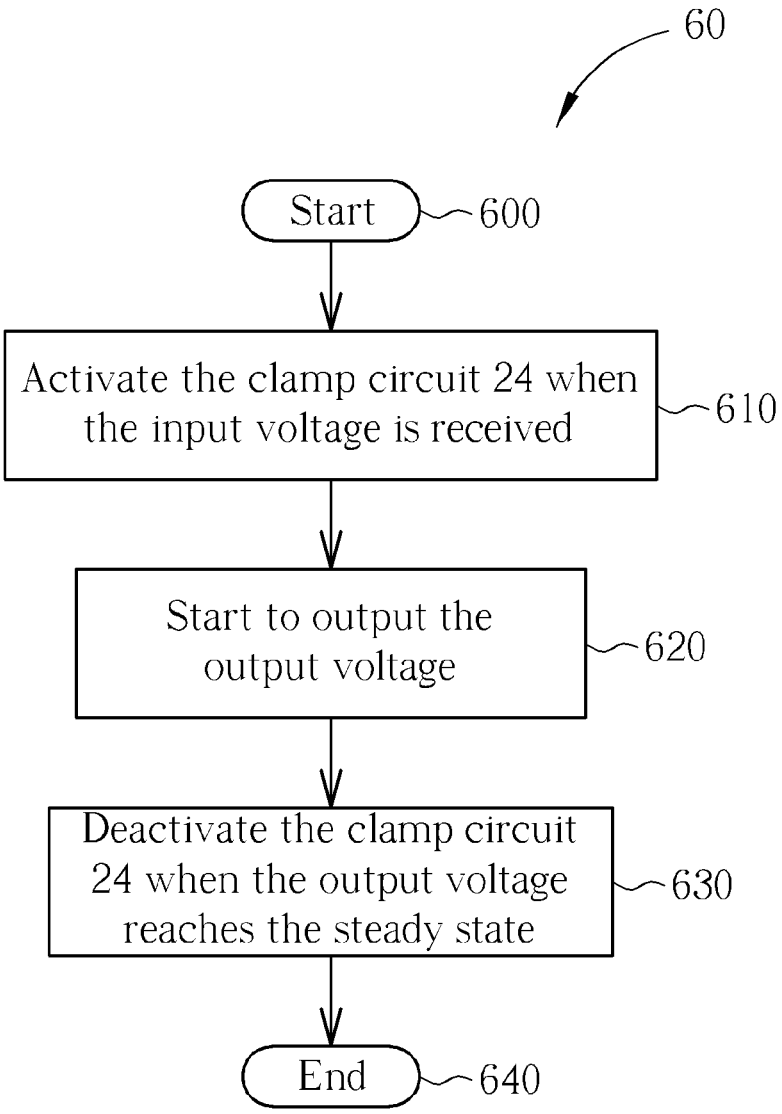
FIG. 6 is a schematic diagram of a voltage overshoot elimination process according to an embodiment of the present invention.

Please refer to FIG. 6. FIG. 6 is a schematic diagram of a voltage overshoot elimination process 60 according to an embodiment of the present invention. The voltage overshoot elimination process 60 is an operating process of the above output buffer circuit 20, and includes the following steps:

Step 600: Start.

Step 610: Activate the clamp circuit 24 when the input voltage is received.

Step 620: Start to output the output voltage.

Step 630: Deactivate the clamp circuit 24 when the output voltage reaches the steady state.

Step 640: End.

According to the voltage overshoot elimination process 60, the output buffer circuit 20 activates the clamp circuit 24 when receiving the input voltage. Next, the output buffer circuit 20 starts to output the output voltage. Not until the output voltage reaches the steady state, does the output buffer circuit 20 deactivates the clamping circuit 24. Operations of the output buffer circuit are detailed in the above embodiments, and are not narrated herein.

To sum up, by adding the clamping circuit to the output buffer circuit, the present invention eliminates the voltage overshoot caused by the strong driving capability of the output stage and avoids the systematic offset voltage being influenced in the low power application via the timing control. In addition, the current consumption and area cost of the operational amplifier are not increased.

Those skilled in the art will readily observe that numerous modifications and alterations of the device and method may be made while retaining the teachings of the invention.

What is claimed is:

1. An output buffer circuit for avoiding voltage overshoot, the output buffer circuit comprising:

an input [stage] *circuit* comprising a positive input terminal, for receiving an input voltage, and a negative input terminal, [—] the input [stage] *circuit* generating a current signal according to the input voltage;

an output bias circuit, coupled to the input [stage] *circuit*, for generating a dynamic bias according to the current signal;

an output [stage] *circuit*, coupled to the input [stage] *circuit* and the output bias circuit, comprising:

an output terminal, reversely coupled to the negative input terminal; and at least one output transistor, coupled to the output bias circuit and the output terminal, for providing a driving current to the output terminal according to the dynamic bias to generate an output voltage;

a clamp circuit, coupled to the input [stage] *circuit*, the output bias circuit and the output [stage] *circuit*, for drawing currents from the output terminal to help the current signal to return the dynamic bias to a proper level when the output voltage exceeds a predefined range; and a [control unit] *controller*, coupled to the clamp circuit, for activating the clamp circuit when the output buffer circuit receives the input voltage and for deactivating the clamp circuit to prevent a leakage current [resulted by] *flowing through* the clamp circuit when the output voltage reaches a steady state.

2. The output buffer circuit of claim 1, wherein the [control unit] *controller* determines the output voltage reaches the steady state when the output buffer circuit receives the input voltage for a predefined time.

3. The output buffer circuit of claim 2, wherein the [control unit] *controller* comprises:

a trigger circuit, for generating a trigger signal when the output buffer circuit receives the input voltage; and a timer, coupled to the trigger circuit, for [calculating the predefined time according to the trigger signal] *controlling the controller to switch a voltage for the clamp circuit to deactivate the clamp circuit after the timer receives the trigger signal and then counts the predefined time*.

4. The output buffer circuit of claim 1, wherein the [control unit] *controller* determines whether the output voltage reaches the steady state by detecting voltage difference between the output terminal and the positive input terminal after the output buffer circuit receives the input voltage.

5. The output buffer circuit of claim 4, wherein the [control unit] *controller* comprises:

a voltage detection circuit, coupled to the positive input terminal and the output terminal, for detecting voltage levels of the positive input terminal and the output terminal; and a [comparison unit] *comparator*, coupled to the voltage detection circuit, for determining the output voltage reaches the steady state when the voltage difference between the output terminal and the positive input terminal is smaller than a predefined value.

6. The output buffer circuit of claim 1, wherein the clamp circuit comprises:

a first metal-oxide-semiconductor field-effect transistor (MOSFET), comprising a [source] *first terminal* coupled to the output terminal, a [gate] *second terminal* coupled to an operating bias, and a [drain] *third terminal*; and a second metal-oxide-semiconductor field-effect transistor (MOSFET), comprising a [source] *first terminal* coupled to the [drain] *third terminal* of the first MOSFET, a [gate] *second terminal* coupled to the output bias circuit and the at least one output transistor, and a [drain] *third terminal* coupled to the [gate] *second terminal of the second MOSFET*;

wherein a level of the operating bias is switched by the [control unit] *controller*.

7. The output buffer circuit of claim 6, wherein the [control unit] *controller* switches the operating bias to a first level to activate the clamp circuit when the output buffer circuit receives the input voltage, and switches the operating bias to a second level to deactivate the clamp circuit when the output voltage reaches the steady state.

8. The output buffer circuit of claim 7, wherein the first MOSFET and the second MOSFET are both P type MOSFETs, for clamping the output voltage under a predefined high voltage level, and the second level is a power supply voltage.

9. The output buffer circuit of claim 7, wherein the first MOSFET and the second MOSFET are both N type MOSFETs, for clamping the output voltage over a predefined low voltage level, and the second level is a ground voltage.

10. The output buffer circuit of claim 1, wherein the input [stage] *circuit* is a differential input [stage] *circuit* having a rail-to-rail input range.

11. The output buffer circuit of claim 10, wherein the input [stage] *circuit* comprises an N type metal-oxide-semiconductor (NMOS) differential input pair and a P type metal-oxide-semiconductor (PMOS) differential input pair.

12. The output buffer circuit of claim 1, wherein the output bias circuit comprises a pair of head-to-tail connected complementary metal-oxide-semiconductor (CMOS) transistors.

13. The output buffer circuit of claim 1, wherein the at least one output transistor form a class AB output [stage] *circuit*.

14. A method of avoiding voltage overshoot for an output buffer circuit, the output buffer circuit comprising an input [stage] *circuit*, an output [stage] *circuit* and a clamp circuit, the input [stage] *circuit* generating a current signal according to an input voltage, the output [stage] *circuit* generating an output voltage according to the current signal, the clamp circuit, coupled to the input [stage] *circuit* and the output [stage] *circuit*, for clamping the output voltage within a predefined range, the method comprising:

activating the clamp circuit when the input voltage is received;

starting to output the output voltage; and deactivating the clamp circuit to prevent a leakage current [resulted by] *flowing through* the clamp circuit when the output voltage reaches a steady state.

15. The method of claim 14, wherein the step of deactivating the clamp circuit when the output voltage reaches the steady state comprises:

determining the output voltage reaches the steady state when the input voltage is received for a predefined time.

16. The method of claim 14, wherein the step of deactivating the clamp circuit when the output voltage reaches the steady state comprises:

determining whether the output voltage reaches the steady state by detecting voltage difference between the output voltage and the input voltage after the input voltage is received.

17. The method of claim 16, wherein the step of determining whether the output voltage reaches the steady state comprises:

determining the output voltage reaches the steady state when the voltage difference between the output voltage and the input voltage is smaller than a predefined value.

*18. An output buffer circuit for avoiding voltage overshoot, comprising:*

*an input circuit, configured to generate a current signal according to an input voltage;*

*an output circuit, coupled to the input circuit and configured to generate an output voltage according to the current signal;*

*a clamp circuit, coupled to the input circuit and the output circuit, and configured to clamp the output voltage within a predefined range; and*

*a controller, configured to activate the clamp circuit when the input voltage is received and deactivate the clamp circuit to prevent a leakage current flowing through the clamp circuit when the output voltage reaches a steady state.*

*19. The output buffer circuit of claim 18, wherein the controller determines the output voltage reaches the steady state when the output buffer circuit receives the input voltage for a predefined time.*

*20. The output buffer circuit of claim 19, wherein the controller comprises:*

*a trigger circuit, for generating a trigger signal when the output buffer circuit receives the input voltage; and*

*a timer, coupled to the trigger circuit, for controlling the controller to switch a voltage for the clamp circuit to deactivate the clamp circuit after the timer receives the trigger signal and then counts the predefined time.*

*21. The output buffer circuit of claim 18, wherein the controller determines whether the output voltage reaches the steady state by detecting voltage difference between the output voltage and the input voltage after the output buffer circuit receives the input voltage.*

*22. The output buffer circuit of claim 21, wherein the controller comprises:*

*a voltage detection circuit, coupled to the input circuit and the output circuit, for detecting voltage levels of the input voltage and the output voltage; and*

*a comparator, coupled to the voltage detection circuit, for determining the output voltage reaches the steady state when the voltage difference between the output voltage and the input voltage is smaller than a predefined value.*

*23. The output buffer circuit of claim 18, wherein the input circuit is a differential input circuit having a rail-to-rail input range.*

*24. The output buffer circuit of claim 18, further comprises*

*an output bias circuit coupled to the input circuit and the output circuit, for generating a dynamic bias according to the current signal.*

* * * * *